United States Patent [19]

Dhong et al.

[11] Patent Number: 4,999,518
[45] Date of Patent: Mar. 12, 1991

[54] MOS SWITCHING CIRCUIT HAVING GATE ENHANCED LATERAL BIPOLAR TRANSISTOR

[75] Inventors: Sang H. Dhong, Mahopac; Chih-Liang Chen, Briarcliff Manor; Hyun J. Shin, Mahopac, all of N.Y.

[73] Assignee: International Business Machines Corp., Armonk, N.Y.

[21] Appl. No.: 447,984

[22] Filed: Dec. 8, 1989

[51] Int. Cl.[5] .......................................... H03K 19/01
[52] U.S. Cl. .................................. 307/446; 307/443; 307/303.1; 307/570; 357/43
[58] Field of Search .............. 307/443, 446, 450, 570, 307/303.1, 303.2; 357/43

[56] References Cited

U.S. PATENT DOCUMENTS

| | | | |
|---|---|---|---|
| 4,331,969 | 5/1982 | Baliga | 357/43 |
| 4,344,081 | 8/1982 | Pao et al. | 357/43 |
| 4,441,117 | 4/1984 | Zommer | 357/43 |
| 4,602,269 | 7/1986 | Koike | 307/446 X |
| 4,901,124 | 2/1990 | Seki | 357/43 X |
| 4,901,131 | 2/1990 | Takahashi | 357/43 |
| 4,907,059 | 3/1990 | Kobayashi et al. | 307/446 X |
| 4,954,865 | 9/1990 | Rokos | 357/43 |

OTHER PUBLICATIONS

Blose et al., "Complementary Bi-FET Logic Circuitry", *IBM T.D.B.*, vol. 15, No. 8, Jan. 1973, pp. 2571-2572.

Lin et al., "Complementary MOS-Bipolar Transistor Structure", *IEEE T.E.L.D.*, vol. ED-16, No. 11, Nov. 1969, pp. 945-951.

Cole, "Is Bi CMOS the Next Technology Driver?", *Electronics*, Feb. 4, 1988, pp. 55-57.

Santo, "BiCMOS Circuitry: The Best of Both Worlds", *IEEE Spectrum*, Mar. 1989, pp. 50-53.

*Primary Examiner*—David Hudspeth
*Attorney, Agent, or Firm*—Pollock, Vande Sande & Priddy

[57] ABSTRACT

Circuitry for implementing a gate enhanced lateral transistor to provide a circuit having a bipolar current driving capability and an FET channel voltage drop. The circuits provide switching of the lateral transistor by enabling both gate and base connections. The device is merged into an FET providing essentially no voltage drop across the collector-emitter connections permitting the collector to reach a full power supply voltage.

8 Claims, 3 Drawing Sheets

MOS SWITCHING CIRCUIT HAVING GATE ENHANCED LATERAL BIPOLAR TRANSISTOR

The present invention relates to MOS implemented lateral bipolar transistor devices. Specifically, a gate controlled lateral bipolar transistor is described which provides the current drive capability of bipolar switching with the voltage drop of an MOS FET switching device.

BiCMOS technology permits the integration in MOS circuit structures of both bipolar transistors and CMOS FET devices. In circuit applications which require driving a high capacitance load, bipolar output transistors are advantageous due to their high level current supply capability. BiCMOS circuits have been developed which include both lateral PNP transistors and vertical NPN transistors, at the cost of increased technological complexity. The lateral PNP transistor is formed inside the N-well of a BiCMOS or CMOS integrated circuit by a narrow field oxide. Typically, the width of the field oxide defining the lateral PNP transistor base region is at the minimum dimension which the lithographic technique for forming these devices permits.

Recent developments have permitted these devices to be defined in ever decreasing dimensions. For instance, using finer lithographic printing, 0.4μm polysilicon gates can be printed in 1.0 μm CMOS technology.

The disadvantage with bipolar devices is the voltage drop with which fully conducting saturated bipolar devices suffer. With FET devices, the fully conducting condition provides substantially zero voltage drop, thus permitting an output voltage swing between Vdd, the drain potential, and Vss, the source potential.

The prior art recognizes that lateral bipolar transistors may be implemented having a gate electrode of polysilicon which defines the base region of the lateral bipolar transistor. In U.S. Pat. No. 4,089,022, a gate electrode is provided which is insulated from the base region of a lateral transistor. The gate electrode is biased to lower the surface potential of the minority carriers. The biasing is essentially a DC voltage which may be used to alter the device performance.

The present invention utilizes such gate equipped lateral transistors to overcome the aforementioned disadvantage of a voltage drop which occurs between the emitter and collector terminals. The bipolar transistor performance therefore resembles an FET device without compromising load capacity or switching speed.

SUMMARY OF THE INVENTION

It is an object of this invention to use a lateral bipolar transistor having a base defined by a polysilicon gate to derive CMOS device performance.

It is a more specific object of this invention to provide a circuit for reducing voltage drop which occurs across a bipolar switching device implemented in a MOS circuit.

It is yet another object of this invention to operate a lateral bipolar transistor having a polysilicon gate as a merged device having properties of both bipolar devices and FET devices.

These and other objects of this invention are provided by a circuit which includes as an output driving device a lateral bipolar transistor having a base region defined by a polysilicon gate. The device is operated as a merged device switching both the gate connection and base connection of the device.

The application of a switching potential to both base and gate connection is effective in ensuring that carriers flow not only inside the device bulk but also along the surface of the silicon.

Use of the conduction path provided by the FET channel of the device permits the output level of the device to reach full output equal to the potential on the emitter which also serves as a source connection. The resulting full power supply swing provides a higher noise margin than is realized with conventional CMOS-implemented bipolar devices.

In a preferred embodiment of the invention, a lateral gate enhanced PNP transistor is implemented with a vertical NPN transistor in a BiCMOS integrated circuit. One or the other of said devices is enabled to conduct current by virtue of a CMOS logic state defined by a PFET and NFET network.

The PNP transistor when enabled by the PFET network is driven with a voltage level so that the base connection and gate connection establish conduction between the emitter and collector connections. The gate voltage will result in the emitter collector connection becoming essentially a P channel with substantially zero voltage drop.

Complementary P channel and N channel devices alternatively connect the respective base and emitter connection of each bipolar transistors together when the bipolar transistor is to be rendered non-conducting.

DESCRIPTION OF THE PREFERRED EMBODIMENT

Figure 1A:
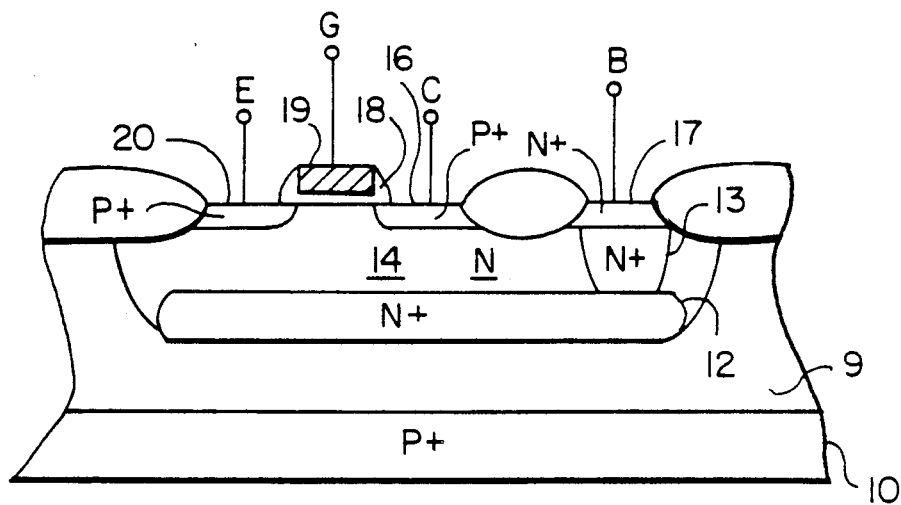
FIG. 1A illustrates a gate enhanced lateral PNP transistor implemented in CMOS technology.
Figure 1B:
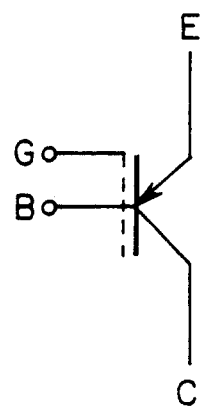
FIG. 1B schematically illustrates the gate enhanced lateral PNP transistor of FIG. 1A.
Figure 1C:
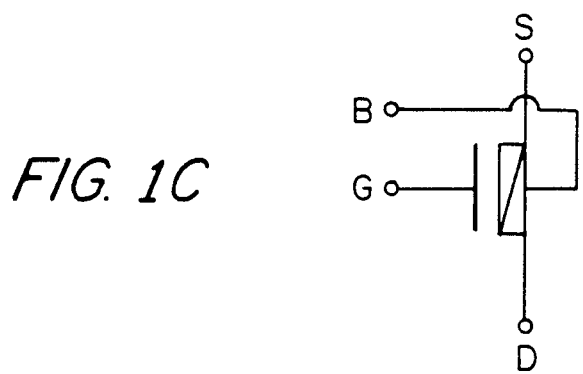
FIG. 1C schematically illustrates the conducting switching state of the gate enhanced lateral PNP transistor of FIG. 1A.

Referring now to FIGS. 1A, 1B and 1C, there is shown a gate enhanced lateral PNP transistor implemented in CMOS. A substrate 10 is shown which is doped to a P+relative doping with respect to the layer 9, also part of the substrate. The gate enhanced lateral PNP transistor has an N-well 14 which connects to a base connection B through an N-type implant 13. A buried layer 12 is shown which also includes an N doping similar to the doping of N-type implant 13. The base connection is effected through the N-type base contact implant 17.

. Disposed on the surface of the N-well 14 are two P-doped regions 16 and 20 which define a collector and emitter of a bipolar device.

Disposed laterally in the region between the collector 16 and emitter 20 is a polysilicon gate 19. The gate is insulated from the collector, base and emitter 16, 14 and 20.

The gate enhanced lateral PNP transistor may be implemented with state-of-the-art CMOS fabrication techniques to have a gate width in the region of 0.5 microns. The device switches faster as the width of the gate region narrows.

To take advantage of the improved switching speed of devices having narrow base widths defined by a polysilicon gate 19, FIGS. 1B and 1C illustrate the effect of switching the lateral PNP from a non-conducting emitter collector circuit to a conducting emitter collector circuit. It can be seen that enabling the base and gate connection together will render the collector emitter circuit conducting. When the gate connection is also switched, the device appears as a MOS FET device as shown in FIG. 1C. In this configuration, the emitter becomes a source, the collector a drain, and the base has essentially no participation in the conduction mode of the device.

As will be evident in the following implementations of the lateral PNP in both pure CMOS fabrication and BiCMOS fabrication, the device of FIG. 1C has essentially no voltage drop from source to drain. Thus, whereas a true bipolar device would always have a voltage drop from collector to emitter (VCE), which deprives the device of a full voltage swing up to the emitter voltage, the device of FIG. 1C has no such voltage drop.

Figure 2:
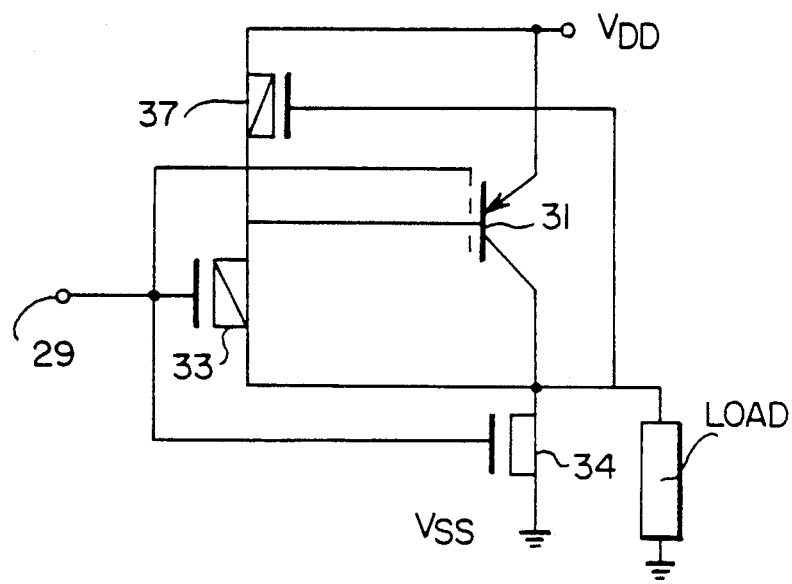
FIG. 2 illustrates an embodiment of the invention implemented in pure CMOS technology.

Illustrated in FIG. 2 is an inverter circuit using the lateral PNP transistor as a high current load driving device. The lateral PNP transistor provides enhanced load driving capabilities, increasing the current to a connected load. The inverter circuit comprises, along with the lateral PNP transistor 31, P channel devices 32 and 33, as well and an N channel device 34. The virtue of the implemented lateral transistor in the inverter circuit of FIG. 2 is to take advantage of the pull-up feature. When lateral PNP transistor 31 is gated to conduct current through the collector emitter circuit, the gate connection permits the device to operate as a fully enabled MOS FET transistor, shown in FIG. 1C. Thus, a full voltage pull-up to level Vdd is achieved, increasing the voltage swing for the inverter, avoiding the usually present VCE voltage drop of bipolar devices.

The base connection of the lateral enhanced PNP transistor 31 is gated into conduction by the operation of P channel device 33 when the input 29 goes low. At this time, not only is the base device 31 conducting current, but the gate is also held at a low potential, thus providing the configuration of FIG. 1C.

During the opposite input condition for the inverter of FIG. 2, a high level signal will gate device 34 on, bringing the collector to essentially Vss. Additionally, the P channel device 32 will connect the base and emitter together, bringing the device to its non-conducting state.

Figure 3:
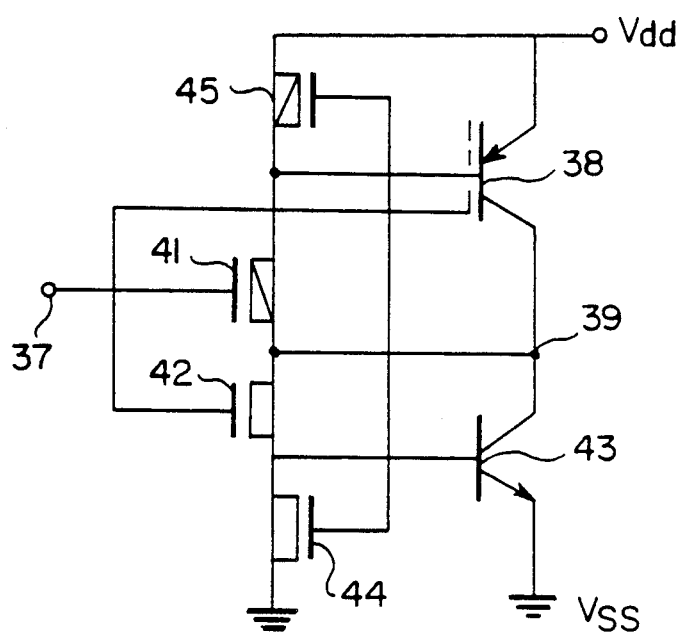
FIG. 3 illustrates a BiCMOS implemented drive circuit using the benefits of a gate switched lateral PNP transistor.

This basic implementation of a pure CMOS inverter may be also implemented in BiCMOS devices as shown in FIG. 3. The BiCMOS driver device provides bipolar drive capability for both states of the logic signal applied to input 37. A lateral PNP transistor 38 is shown for driving the output node 39 to the full Vdd voltage level during the first logic input condition to input 37. A vertical implemented NPN transistor 43 is shown for providing current sinking from node 39 to Vss during the second logic input condition applied to input 37. Switching the lateral PNP transistor gate as well as the base permits the junction 39, during the pull-up mode, to be brought essentially to Vdd, eliminating the disadvantage of bipolar device collector emitter voltage drop. During the opposite logic condition, node 39 will be brought to a potential which is essentially the voltage drop across NPN transistor 43, VCE, above the desired power supply voltage Vss.

Switching of these two complementary bipolar devices is shown using a PFET network comprising a PFET 41, 45, as well as an NFET network comprising devices 42 and 44. During a first logic condition applied to input 37, device 41 is rendered conducting, thus enabling the base connection of the lateral PNP transistor 38. At the same time, the gate of this device is used to increase the hole diffusion through the base of lateral PNP transistor 38, rendering the device to a conducting configuration as shown in FIG. 1C.

During the opposite logic state, vertical NPN transistor 43 is rendered conducting by the operation of NFET 42. When the device 38 is returned to a non-conducting mode, the P channel device 45 assists in turning device 38 into the non-conducting mode of FIG. 1B. Similarly, the N channel device 44 will tend to bias the NPN vertical bipolar transistor 43 in the off state.

Figure 4:
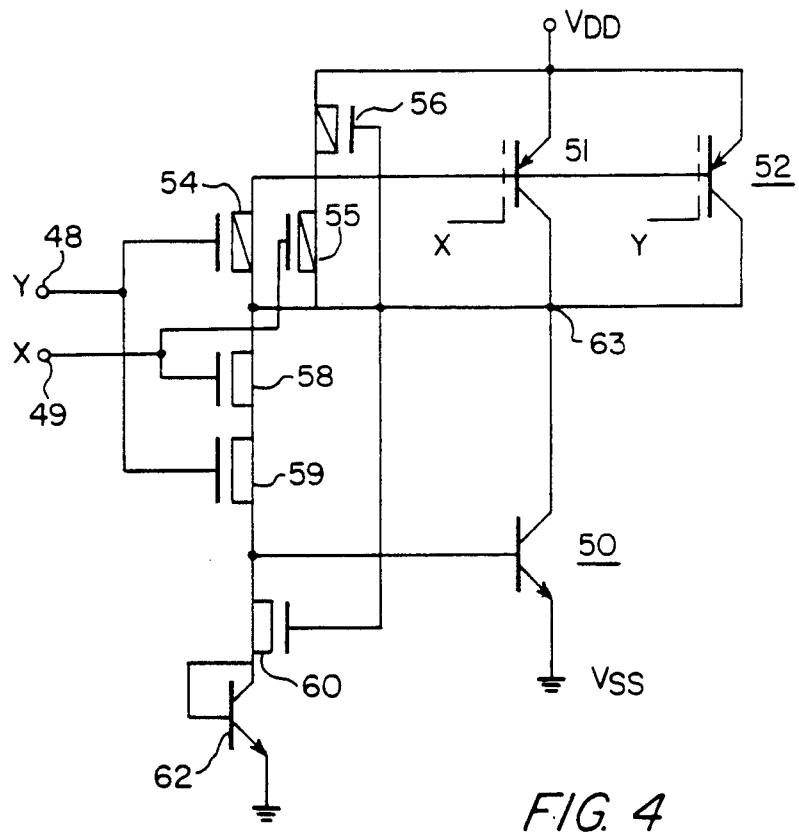
FIG. 4 illustrates a two input NAND logic circuit with a BiCMOS complementary drive circuit.

FIG. 4 illustrates how the inverter circuits previously described may be used to implement standard logic circuitry. A two input NAND gate is shown in FIG. 4, using a vertically implemented NPN transistor 50, and two lateral PNP transistors 51 and 52. The operation of the two input NAND circuits requires a PFET network and NFET network. The PFET network shown has a pair of PFET devices 54 and 55 which are used to enable the bases of lateral PNP transistors 51 and 52. These gates of the PFET network are enabled by the logic state applied to inputs 48 and 49 representing logical values of X and Y. Additionally, the same logic inputs are applied to the gate connections for lateral PNP transistors 51 and 52. Thus, when the value of X is zero, both the gate and base of lateral PNP transistor 51 is rendered conducting. Additionally, when the logic state Y is zero, the gate and base of gate enhanced later PNP transistor 52 is rendered conducting by the voltage applied to the base and polysilicon gate connection.

The NFET network comprises NFET devices 58 and 59, which conduct when both X and Y are at a logic 1 condition. Under this condition, the vertically implemented NPN transistor 50 is conducting through its collector emitter connection. Devices 60 and 62 participate in the turn-off of the vertical NPN transistor 50. Thus, when either of PNP devices 51 and 52 are conducting, NFET device 60 will effectively bias the vertical NPN device 50 to a non-conducting state, through the bipolar diode 62. Similarly, the PFET device 56 is used to hold devices 51 and 52 non-conducting when NPN device 50 is conducting. It is thus clear that the gate enhanced lateral PNP devices 51 and 52 will both provide an output node 63 the full Vdd level. When both X and Y are at the logic one ("1") state, the NPN device 50 will provide the logic NAND output zero on node 63. This logic zero will be equal to the potential drop across NPN transistor 50 in the fully conducting state, i.e. VCE.

Thus, there are described several embodiments for either CMOS or BiCMOS implementation, including an improved switching circuit which uses a gate enhanced lateral PNP device as a merged bipolar and FET device. In switching the gate connection of the PNP device with a base switching signal, it is possible to derive the benefits of high current switching capability of a bipolar device with a zero voltage drop across the fully conducting merged FET device.

Figure 5:
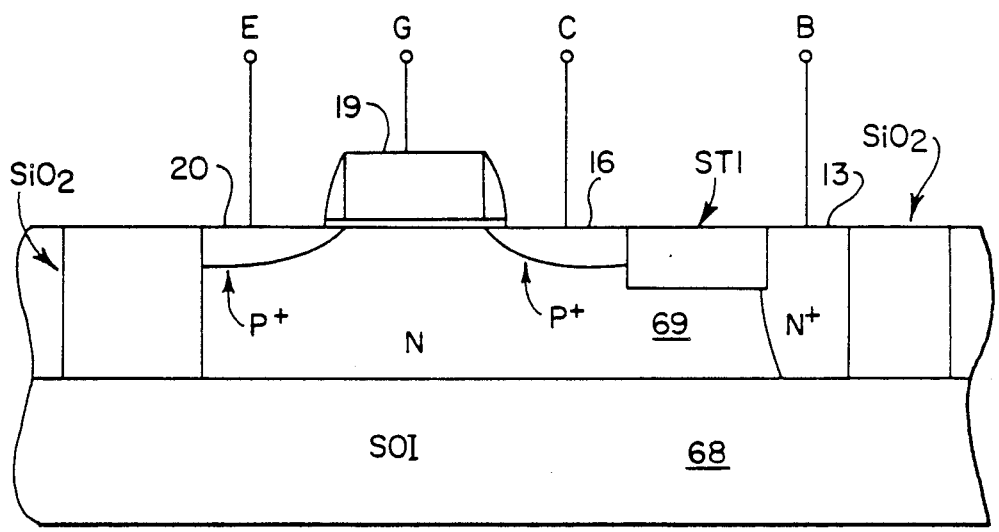
FIG. 5 illustrates an SOI implemented lateral PNP transistor which may be adapted for use in the foregoing circuits.

The foregoing preferred embodiments were described with respect to gate enhanced lateral PNP devices. However, it should also be appreciated that the invention may be implemented in SOI technology. A gate enhanced lateral PNP transistor, in this technology, is shown generally in FIG. 5. In this Figure, there is a bottom insulator 68 and a deep trench oxide 69 for device isolation, and a shallow trench oxide 70 for junction isolation. This implementation has a smaller base region and reduced parasitic PNP components. Base charge is minimized and downward or parasitic injection from the emitter is also suppressed. For a retrograde N substrate, the vertical injection is suppressed further and extrinsic base resistance is low. As a consequence, the device would have a lateral PNP current gain and frequency characteristics better than that implemented according to the previously described CMOS implemented devices.

The use of a gate enhanced lateral NPN transistor may also be possible in accordance with the invention. Recent developments suggest that N doped substrates may form the basis of a lateral transistor having a P well. Such P well devices would permit the implementation of an insulated gate between collector and emitter N doped regions. These devices may therefore be utilized in applications which are analogous to the foregoing PNP implemented circuits.

Thus, there is described with respect to several embodiments, circuit implementations used gate enhanced lateral PNP devices. Those skilled in the art will recognize yet other embodiments of the invention described more particularly by the claims which follow.

Having thus described our invention, what we claim as new and desire to secure by Letters Patent is:

1. An integrated MOS circuit which provides bipolar switching speed and decreased voltage drop during conduction comprising:
   a laterally implemented bipolar transistor having a base connection, emitter connection, and collector connection, said emitter and collector connections separated by a polysilicon gate connection defining the width of said bipolar transistor lateral base;
   a CMOS switching circuit having a CMOS logic circuit output connection connected to said bipolar transistor base connections, and a CMOS logic circuit connection connected to said gate connection, wherein said CMOS switching circuit applies simultaneous switching potential to said base connection and to said gate connection, and said bipolar transistor, collector-emitter circuit is forced during a conduction interval into an MOS device.

2. The integrated circuit of claim 1 wherein said CMOS switching circuit comprises a PFET network for receiving first and second logic input signal states, connected across said lateral PNP transistor base connection and said collector connection, wherein said laterally implemented bipolar transistor collector emitter circuit is enabled into conduction.

3. The integrated circuit of claim 2 further comprising:
   an NPN bipolar transistor having a collector connected to said PNP bipolar transistor collector;
   an NFET network having an input common to said PFET network input; connected to enable said NPN bipolar transistor collector emitter circuit into conduction;
   a P channel device connecting said PNP transistor base to said PNP transistor emitter and having a gate connection connected to said collector connections; and,
   an N channel device connecting said NPN transistor base to said NPN transistor emitter, and having a gate connection connected to said collector connections, said P channel and N channel devices biasing respective PNP and NPN bipolar transistors out of conduction when the other of said PNP and NPN bipolar transistors are conducting.

4. An integrated MOS circuit comprising:
   a lateral bipolar transistor having a base connection, emitter connection, collector connection, and a gate connection disposed between said emitter and collector connections; and,
   a CMOS logic circuit for connecting said base and collector connections together in response to a first logic condition, and simultaneously applying a turn-on biasing condition to said gate connection, switching said bipolar transistor emitter collector circuit into conduction with a substantially zero voltage drop between collector and emitter connections, said CMOS logic circuit connecting said base and emitter connections together in response to a second logic condition.

5. The integrated MOS circuit of claim 4 wherein said CMOS logic circuit comprises:
   a first P channel device connecting said base and collector together, and having a gate connection connected to said bipolar transistor gate connection;
   a second P channel device connecting said bipolar transistor emitter connection to said base connection, and having a gate connection connected to said collector connection; and,
   an N channel device serially connecting said collector connection to a common connection, having a gate connection connected to said bipolar transistor gate connection, whereby said first and second logic conditions are established by first and second alternative logic states applied between said bipolar transistor gate connection and said common connection.

6. An integrated BiCMOS circuit for driving a large capacitance load comprising:
   a lateral PNP bipolar transistor having a base connection, emitter connection, and collector connection, said emitter and collector connections separated by a gate connection;
   an NPN bipolar transistor having a collector connection connected to said PNP transistor collector connection; and,
   a CMOS logic network connected to receive logic signals, and connected to enable one of said bipolar transistors to conduct through its collector emitter connections in response to first and second logic conditions, said CMOS logic network connecting the base of said lateral PNP bipolar transistor to said collector of said lateral PNP bipolar transistor during one of said logic conditions, as well as enabling said gate connection whereby said lateral PNP bipolar transistor produces a P channel between said collector emitter connections having substantially zero voltage difference between said collector-emitter connections.

7. The integrated circuit of claim 6 wherein said CMOS logic network connects the base and emitter connections of said lateral PNP bipolar transistor together during a remaining of said logic conditions.

8. The integrated circuit of claim 7 wherein said CMOS logic circuit connects said NPN bipolar transistor base to said NPN transistor emitter during said one logic condition.

* * * * *